United States Patent
Hayk et al.

(10) Patent No.: US 10,256,430 B2
(45) Date of Patent: Apr. 9, 2019

(54) ORGANIC LIGHT EMITTING DIODE DISPLAY AND METHOD FOR MANUFACTURING ORGANIC LIGHT EMITTING DIODE DISPLAY

(71) Applicant: SAMSUNG DISPLAY CO., LTD., Yongin-si, Gyeonggi-do (KR)

(72) Inventors: Khachatryan Hayk, Hwaseong-si (KR); Ki Hyun Kim, Daegu (KR); Sun Ho Kim, Seongnam-si (KR); Jeong Ho Kim, Seoul (KR); Tae Woong Kim, Seongnam-si (KR); Dan Bi Choi, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/410,392

(22) Filed: Jan. 19, 2017

(65) Prior Publication Data
US 2017/0222176 A1    Aug. 3, 2017

(30) Foreign Application Priority Data

Feb. 1, 2016    (KR) .......................... 10-2016-0012390

(51) Int. Cl.
*H01L 29/08* (2006.01)
*H01L 51/52* (2006.01)
(Continued)

(52) U.S. Cl.
CPC ...... *H01L 51/5237* (2013.01); *H01L 51/0097* (2013.01); *H01L 51/5253* (2013.01);
(Continued)

(58) Field of Classification Search
CPC ............. H01L 21/5237; H01L 51/5253; H01L 51/0097; H01L 51/56; H01L 51/524;
(Continued)

(56) References Cited

U.S. PATENT DOCUMENTS 9,054,340 B2    6/2015  Kim
9,101,007 B2 *  8/2015  Chan ...................... H05B 33/04
(Continued)

FOREIGN PATENT DOCUMENTS

EP    2 837 651       2/2015
KR    10-0659533     12/2006
(Continued)

OTHER PUBLICATIONS

Gregory.P. Crawford, "Flexible Flat Panel Displays," John Wiley & Sons, Ltd., 2005, pp. 1-55.
(Continued)

*Primary Examiner* — Thinh T Nguyen
(74) *Attorney, Agent, or Firm* — F. Chau & Associates, LLC

(57) ABSTRACT

An organic light emitting device includes a substrate. An organic light emitting diode is disposed on the substrate. A thin film encapsulation layer is disposed over the organic light emitting diode. The thin film encapsulation layer includes at least one organic layer. An organic passivation layer is disposed directly on the thin film encapsulation layer. The organic passivation layer has a smaller Young's modulus than the organic layer of the thin film encapsulation layer.

15 Claims, 7 Drawing Sheets

(51) Int. Cl.
*H01L 51/00* (2006.01)
*H01L 51/56* (2006.01)
H01L 21/56 (2006.01)
H01L 23/29 (2006.01)

(52) U.S. Cl.
CPC .............. *H01L 51/56* (2013.01); *H01L 21/56* (2013.01); *H01L 23/293* (2013.01); *H01L 2924/00* (2013.01); *H01L 2924/0002* (2013.01)

(58) Field of Classification Search
CPC ... H01L 23/293; H01L 21/56; H01L 2924/00; H01L 2924/0002
USPC ...... 257/40, 98, 99, 100, 79; 438/82, 99, 22, 438/29
See application file for complete search history.

(56) References Cited

U.S. PATENT DOCUMENTS

| | | | | |
|---|---|---|---|---|
| 9,806,293 | B2* | 10/2017 | Yoo | B32B 3/04 |
| 2010/0213819 | A1* | 8/2010 | Cok | H01L 27/3255 |
| | | | | 313/498 |
| 2011/0272827 | A1* | 11/2011 | Blizzard | C09J 4/00 |
| | | | | 257/788 |
| 2014/0217621 | A1* | 8/2014 | Yoo | B32B 3/04 |
| | | | | 257/788 |
| 2015/0014646 | A1* | 1/2015 | Kaplan | H01L 51/5253 |
| | | | | 257/40 |
| 2015/0163866 | A1* | 6/2015 | Chan | H05B 33/04 |
| | | | | 313/512 |
| 2016/0093828 | A1* | 3/2016 | Kim | H01L 51/5253 |
| | | | | 257/40 |
| 2016/0218320 | A1* | 7/2016 | Chen | H01L 51/5256 |

FOREIGN PATENT DOCUMENTS

| | | |
|---|---|---|
| KR | 10-2010-0130898 | 12/2010 |
| KR | 10-2014-0043022 | 4/2014 |

OTHER PUBLICATIONS

Kimberly J. Allen, "Reel to Real: Prospects For Flexible Displays," Proceedings of the IEEE, vol. 93, No. 8, Aug. 2005, pp. 1394-1399.
Jesmin Haq, et al., "Temporary Bond-Debond Technology for High-Performance Trasistors on Flexible Substrates," Journal of the SID 18/11, 2010, pp. 884-891.
Kazushige Takechi, et al., "Very Hight Rate and Uniform Glass Etching with HF/HCI Spray for Transferry Thin-Film Transistor Arrays to Flexible Substrates," Japanese Journal of Applied Physics vol. 45, No. 7, 2006, pp. 6008-6010.

* cited by examiner

ORGANIC LIGHT EMITTING DIODE DISPLAY AND METHOD FOR MANUFACTURING ORGANIC LIGHT EMITTING DIODE DISPLAY

CROSS-REFERENCE TO RELATED APPLICATIONS

This application claims priority to and the benefit of Korean Patent Application No. 10-2016-0012390, filed in the Korean Intellectual Property Office on Feb. 1, 2016, the entire contents of which are incorporated by reference herein.

TECHNICAL FIELD

The present disclosure relates to an organic light emitting device, and more specifically, to an organic light emitting diode display device and a method for manufacturing the organic light emitting diode display device.

DISCUSSION OF THE RELATED ART

In general, an organic light emitting diode (OLED) display device includes a substrate, an OLED provided on the substrate, and a thin film encapsulation layer provided on the substrate with the OLED disposed therein.

The conventional OLED display device includes a passivation film attached to the thin film encapsulation layer to protect the thin film encapsulation layer. The passivation film is attached to the thin film encapsulation layer by an adhesive layer.

SUMMARY

An organic light emitting device includes a substrate. An organic light emitting diode is disposed on the substrate. A thin film encapsulation layer is disposed over the organic light emitting diode. The thin film encapsulation layer includes at least one organic layer. An organic passivation layer is disposed directly on the thin film encapsulation layer. The organic passivation layer has a smaller Young's modulus than the organic layer of the thin film encapsulation layer.

A method for manufacturing an organic light emitting device includes disposing an organic light emitting diode on a substrate. A thin film encapsulation layer is disposed over the organic light emitting diode and the substrate. An organic passivation layer, having a smaller Young's modulus than that of the thin film encapsulation layer, is deposited on a surface of the thin film encapsulation layer.

An organic light emitting device includes a flexible substrate. A thin film encapsulation layer is disposed on the flexible substrate. An organic light emitting diode is encapsulated between the thin film encapsulation layer and the flexible substrate. An organic passivation layer is disposed over the thin film encapsulation layer. The thin film encapsulation layer is more elastic than the organic passivation layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
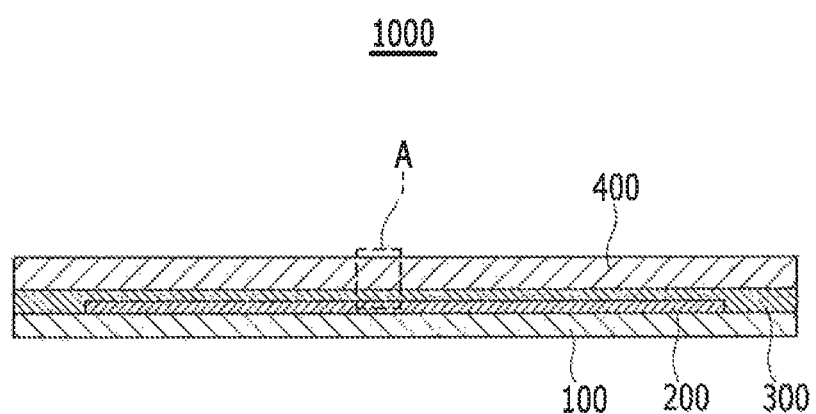
FIG. 1 is a cross-sectional view illustrating an organic light emitting device according to an exemplary embodiment of the present disclosure.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The same reference numerals may be used to designate similar or identical elements throughout the disclosure and the several figures.

In the drawings, the thickness of layers, films, panels, regions, etc., may be exaggerated for clarity. When it is said that any part, such as a layer, film, region, or plate, is positioned on another part, it means the part is directly on the other part or above the other part with at least one intermediate part disposed therebetween.

An organic light emitting device according to an exemplary embodiment of the present disclosure will now be described with reference to FIG. 1 and FIG. 2.

FIG. 1 is a cross-sectional view illustrating an organic light emitting device according to an exemplary embodiment of the present disclosure.

As shown in FIG. 1, the organic light emitting device 1000 includes a substrate 100, an organic light emitting diode (OLED) 200, a thin film encapsulation layer 300, and an organic passivation layer 400.

The substrate 100 may be flexible, for example, the substrate 100 may be a film-type substrate including an organic material such as polyimide. The substrate 100 may be an insulating substrate including glass or metal. A driving layer including a plurality of thin film transistors may be connected to the organic light emitting diode 200. The driving layer may be disposed on the substrate 100, and the driving layer may have various configurations.

The organic light emitting diode 200 includes two electrodes facing each other, and an organic emission layer disposed between the two electrodes. The organic emission layer may emit light. At least one of the two electrodes may be a light transmissive electrode or a light semi-transmissive electrode. The light emitted by the organic emission layer may transmit through the light transmissive electrode or the light semi-transmissive electrode. The organic light emitting diode 200 may have various configurations.

Figure 2:
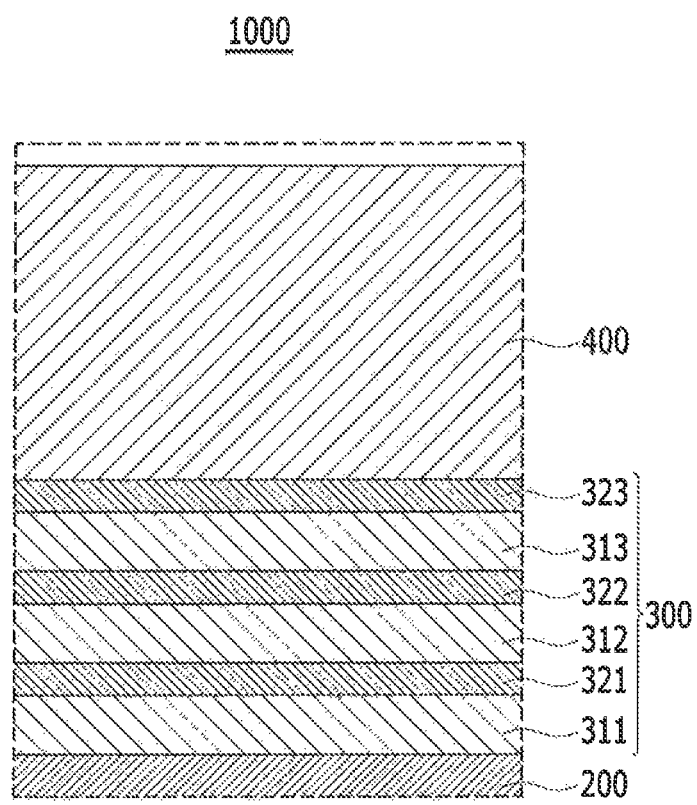
FIG. 2 is a cross-sectional view illustrating an enlarged portion "A" of FIG. 1.

FIG. 2 is a cross-sectional view illustrating an enlarged portion "A" of FIG. 1.

As shown in FIG. 2, the thin film encapsulation layer 300 is provided on the substrate 100 with an organic light emitting diode 200 disposed therebetween. The thin film encapsulation layer 300 seals the organic light emitting diode 200 together with the substrate 100. The thin film encapsulation layer 300 includes at least one organic layer disposed on the organic light emitting diode 200 and at least one inorganic layer disposed on the organic light emitting diode 200. The thin film encapsulation layer 300 includes a first organic layer 311, a second organic layer 312, a third organic layer 313, a first inorganic layer 321, a second inorganic layer 322, and a third inorganic layer 323.

The first inorganic layer 321 is disposed between the first organic layer 311 and the second organic layer 312, the second inorganic layer 322 is disposed between the second organic layer 312 and the third organic layer 313, and the third inorganic layer 323 is disposed on the third organic layer 313. For example, an inorganic layer is disposed between neighboring organic layers from among a plurality of organic layers. Further, an organic layer is disposed between neighboring inorganic layers from among a plurality of inorganic layers.

The third inorganic layer 323 is disposed on an uppermost layer of the thin film encapsulation layer 300. An organic layer may be disposed on the uppermost payer of the thin film encapsulation layer 300.

The first organic layer 311, the second organic layer 312, and the third organic layer 313 may respectively include an organic material. The first organic layer 311, the second organic layer 312, and the third organic layer 313 may each include a single layer or may include multiple layers, including polyethylene terephthalate, polyimide, polycarbonate, epoxy, polyethylene, and/or polyacrylate.

The first inorganic layer 321, the second inorganic layer 322, and the third inorganic layer 323, may each include an inorganic material. The first inorganic layer 321, the second inorganic layer 322, and the third inorganic layer 323 may each include a single layer or may each include multiple layers including a silicon nitride ($SiN_x$), an aluminum oxide ($Al_2O_3$), a silicon oxide ($SiO_2$), and/or a titanium oxide ($TiO_2$).

The organic passivation layer 400 is disposed on the thin film encapsulation layer 300. The organic passivation layer 400 protects the thin film encapsulation layer 300. The organic passivation layer 400 directly contacts the thin film encapsulation layer 300. The organic passivation layer 400 directly contacts the third inorganic layer 323 disposed on the uppermost layer of the thin film encapsulation layer 300. No adhesive layer is disposed between the organic passivation layer 400 and the third inorganic layer 323. For example, the adhesive layer is not disposed between the organic passivation layer 400 and the thin film encapsulation layer 300.

The organic passivation layer 400 is thicker than the thin film encapsulation layer 300. The organic passivation layer 400 is thicker than each of the first organic layer 311, the second organic layer 312, and the third organic layer 313 of the thin film encapsulation layer 300. For example, the organic passivation layer 400 may be 50 um to 500 um thick, but the organic passivation layer 400 is not limited to this particular thickness. For example, the organic passivation layer 400 may be 70 um to 100 um thick.

The organic passivation layer 400 may be different from each of the first organic layer 311, the second organic layer 312, and the third organic layer 313 of the thin film encapsulation layer 300. The organic passivation layer 400 may be different from the thin film encapsulation layer 300.

The organic passivation layer 400 that is thicker than the thin film encapsulation layer 300 covers the thin film encapsulation layer 300, thereby suppressing the thin film encapsulation layer 300 from being broken.

The organic passivation layer 400 is deposited on a surface of the thin film encapsulation layer 300 by using a deposition process such as a chemical vapor deposition (CVD) process.

According to an exemplary embodiment of the present disclosure, the organic passivation layer 400 may be deposited on the surface of the thin film encapsulation layer 300 by using a different deposition process such as an atomic layer deposition (ALD) process.

The conventional organic light emitting device positions the adhesive layer on the surface of the thin film encapsulation layer and attaches a passivation film to the thin film encapsulation layer by using the adhesive layer so as to protect the thin film encapsulation layer.

However, the organic light emitting device 1000 according to an exemplary embodiment of the present disclosure may be thinner than the conventional organic light emitting device since no adhesive layer is disposed between the organic passivation layer 400 and the thin film encapsulation layer 300 and the organic passivation layer 400 directly contacts the thin film encapsulation layer 300.

For example, the organic light emitting device 1000 that protects the thin film encapsulation layer 300 may be relatively thin.

Further, the organic light emitting device 1000, according to an exemplary embodiment of the present disclosure, 21 may prevent impurities from infiltrating into the surface of the thin film encapsulation layer 300 during the deposition process since the organic passivation layer 400 is not attached to the surface of the thin film encapsulation layer 300 by the adhesive layer but rather is deposited on the surface of the thin film encapsulation layer 300.

For example, compared to the conventional organic light emitting device, the organic light emitting device 1000 preventing impurities from infiltrating into the surface of the thin film encapsulation layer 300 is provided.

The organic passivation layer 400 has a smaller Young's modulus than the thin film encapsulation layer 300. The organic passivation layer 400 may have a smaller Young's modulus than each of the first organic layer 311, the second organic layer 312, and the third organic layer 313 of the thin film encapsulation layer 300. The organic passivation layer 400 includes an organic material that is different from each of the first organic layer 311, the second organic layer 312, and the third organic layer 313 of the thin film encapsulation layer 300. The organic passivation layer 400 may include poly-para-xylylene, polyvinylidene fluoride, polymethylsiloxane, polybutadiene, polymethylmethacrylate, polyacrolein, and/or polydivinylbenzene.

The organic light emitting device 1000 according to an exemplary embodiment may include an organic passivation layer 400 that has a smaller Young's modulus than the thin film encapsulation layer 300 to reduce the Young's modulus of the entire organic light emitting device 1000, thereby increasing flexibility of the organic light emitting device 1000.

For example, the increased-flexibility organic light emitting device 1000 is provided.

Regarding the conventional organic light emitting device, an adhesive layer is disposed between the thin film encapsulation layer and the passivation film. The adhesive layer includes a flexible material such as silicone, polyurethane, and acryl, and has a small Young's modulus.

However, regarding the organic light emitting device 1000 according to an exemplary embodiment of the present disclosure, the organic passivation layer 400 has a larger Young's modulus than the conventional adhesive layer.

A yield stress of one configuration is proportional to the Young's modulus of one configuration, which will now be described.

The yield stress of one configuration corresponds to Equation 1.

$$\Delta\sigma_y = Gb\sqrt{\rho} \quad \text{[Equation 1]}$$

Here, $\sigma_y$ is a yield stress, G is a shear modulus, b is a magnitude of the Burgers vector, and $\rho$ is a dislocation density.

According to Equation 1, the yield stress of one configuration is proportional to the shear modulus.

The shear modulus of one configuration corresponds to Equation 2.

$$E = 2G(1+v) = 3K(1-2v) \quad \text{[Equation 2]}$$

Here, E is a Young's modulus, G is a shear modulus, K is a bulk modulus, and v is a Poisson's ratio.

Regarding Equation 2, the shear modulus of one configuration is proportional to the Young's modulus.

In consideration of Equation 1 and Equation 2, the yield stress of one configuration is proportional to the shear modulus in Equation 1 and the shear modulus of one configuration is proportional to the Young's modulus in Equation 2, so the yield stress of one configuration is proportional to the Young's modulus of one configuration.

As described, regarding the organic light emitting device 1000 according to an exemplary embodiment of the present disclosure, the organic passivation layer 400 has a larger Young's modulus than the conventional adhesive layer so the Young's modulus of the entire organic light emitting device 1000 according to an exemplary embodiment of the present disclosure is larger than that of the conventional organic light emitting device, thereby increasing the yield stress, compared to the conventional organic light emitting device.

Accordingly, the adhesive layer is not disposed between the organic passivation layer 400 and the thin film encapsulation layer 300 and so the organic passivation layer 400 directly contacts the thin film encapsulation layer 300. Accordingly, the organic light emitting device 1000, according to an exemplary embodiment of the present disclosure, is manufactured to be thinner than the conventional organic light emitting device.

For example, the organic light emitting device 1000 is able to protect the thin film encapsulation layer 300 and is manufactured to be thinner than conventional organic light emitting devices.

Further, regarding the organic light emitting device 1000 according to an exemplary embodiment of the present disclosure, the organic passivation layer 400 is not attached to the surface of the thin film encapsulation layer 300 by an adhesive layer but rather is deposited on the surface of the thin film encapsulation layer 300, thereby preventing impurities from infiltrating the surface of the thin film encapsulation layer 300 during the deposition process.

For example, compared to the conventional organic light emitting device, the organic light emitting device 1000 preventing impurities from infiltrating the surface of the thin film encapsulation layer 300 is provided.

In addition, regarding the organic light emitting device 1000 according to an exemplary embodiment of the present disclosure, the organic passivation layer 400 has a larger Young's modulus than the conventional adhesive layer so the Young's modulus of the entire organic light emitting device 1000, according to an exemplary embodiment of the present disclosure, is larger than that of the conventional organic light emitting device, thereby increasing the yield stress, compared to the conventional organic light emitting device.

For example, the yield stress-increased organic light emitting device 1000 is provided. The yield stress of the organic light emitting device 1000 is increased, thereby preventing the organic light emitting device 1000 from being permanently deformed by an external stress.

Further, regarding the organic light emitting device 1000 according to an exemplary embodiment of the present disclosure, the organic passivation layer 400 has a smaller Young's modulus than the thin film encapsulation layer 300 to reduce the Young's modulus of the organic light emitting device 1000, thereby increasing flexibility of the organic light emitting device 1000.

For example, the flexibility-increased organic light emitting device 1000 is provided.

An organic light emitting device according to an exemplary embodiment of the present invention will now be described with reference to FIG. 3 and FIG. 4.

Figure 3:
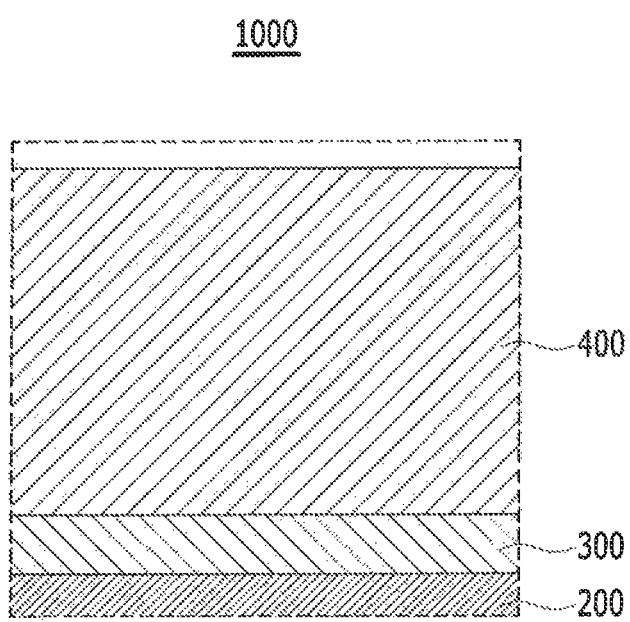
FIG. 3 is a cross-sectional view illustrating an organic light emitting device according to an exemplary embodiment of the present disclosure.

FIG. 3 shows a cross-sectional view of an organic light emitting device according to an exemplary embodiment of the present invention.

As shown in FIG. 3, a thin film encapsulation layer 300 of an organic light emitting device 1000, according to an exemplary embodiment of the present disclosure, includes an inorganic layer disposed on an organic light emitting diode 200. The thin film encapsulation layer 300 may be a single layer or it may be multiple layers, any layer of which including a silicon nitride ($SiN_x$), an aluminum oxide ($Al_2O_3$), a silicon oxide ($SiO_2$), and/or a titanium oxide ($TiO_2$).

The organic passivation layer 400 is disposed on the thin film encapsulation layer 300. The organic passivation layer 400 protects the thin film encapsulation layer. The organic passivation layer 400 directly contacts the thin film encapsulation layer 300. An adhesive layer is not disposed between the organic passivation layer 400 and the thin film encapsulation layer 300.

The organic passivation layer 400 has a smaller Young's modulus than the thin film encapsulation layer 300.

The organic passivation layer 400 is deposited on a surface of the thin film encapsulation layer 300.

The organic passivation layer 400 is thicker than the thin film encapsulation layer 300 including an inorganic layer.

As described above, no adhesive layer is disposed between the organic passivation layer 400 and the thin film encapsulation layer 300 and the organic passivation layer 400 directly contacts the thin film encapsulation layer 300 so the organic light emitting device 1000, according to an exemplary embodiment of the present disclosure, is thinner than the conventional organic light emitting device.

In an organic light emitting device 1000, according to an exemplary embodiment of the present disclosure, the organic passivation layer 400 is not attached to the surface of the thin film encapsulation layer 300 by an adhesive layer but is rather deposited directly onto the surface of the thin film encapsulation layer 300, thereby preventing the infiltration of impurities into the surface of the thin film encapsulation layer 300 during the deposition process.

In an organic light emitting device 1000 according to an exemplary embodiment of the present disclosure, the organic passivation layer 400 has a larger Young's modulus than the conventional adhesive layer so the Young's modulus of the organic light emitting device 1000, according to an exemplary embodiment of the present disclosure, is larger than that of the conventional organic light emitting device, thereby increasing the yield stress compared to the conventional organic light emitting device.

In an organic light emitting device 1000 according to an exemplary embodiment of the present disclosure, the organic passivation layer 400 has a smaller Young's modulus than the thin film encapsulation layer 300 to reduce the Young's modulus of the organic light emitting device 1000, thereby increasing flexibility of the organic light emitting device 1000.

Figure 4:
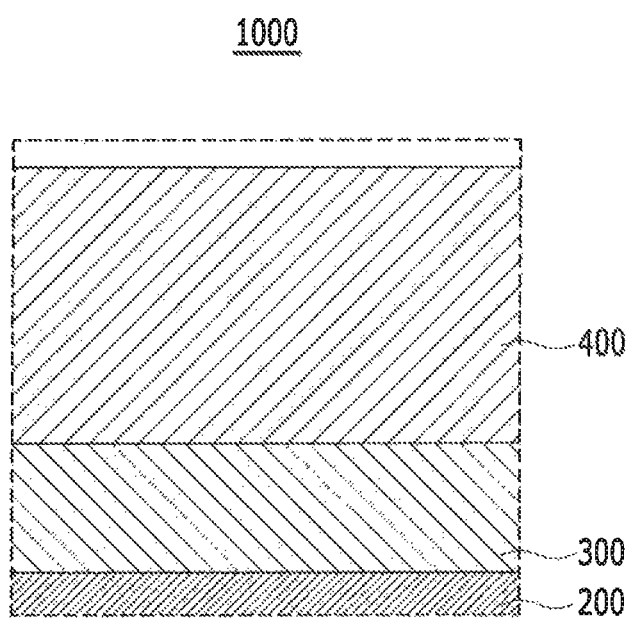
FIG. 4 is a cross-sectional view illustrating part of an organic light emitting device according to an exemplary embodiment of the present disclosure.

FIG. 4 shows a cross-sectional view of part of an organic light emitting device according to an exemplary embodiment of the present disclosure.

As shown in FIG. 4, the thin film encapsulation layer 300 of the organic light emitting device 1000, according to an exemplary embodiment of the present disclosure, includes an organic layer disposed on the organic light emitting diode 200. The thin film encapsulation layer 300 may be a single layer or may include multiple layers, each layer of which may include polyethylene terephthalate, polyimide, polycarbonate, epoxy, polyethylene, and/or polyacrylate.

The organic passivation layer 400 is disposed on the thin film encapsulation layer 300. The organic passivation layer 400 protects the thin film encapsulation layer 300. The organic passivation layer 400 directly contacts the thin film encapsulation layer 300. An adhesive layer is not disposed between the organic passivation layer 400 and the thin film encapsulation layer 300.

The organic passivation layer 400 has a smaller Young's modulus than the thin film encapsulation layer 300.

The organic passivation layer 400 is deposited on the surface of the thin film encapsulation layer 300.

The organic passivation layer 400 is thicker than the thin film encapsulation layer 300 including an organic layer.

Accordingly, the adhesive layer is not disposed between the organic passivation layer 400 and the thin film encapsulation layer 300, and the organic passivation layer 400 directly contacts the thin film encapsulation layer 300 so the organic light emitting device 1000, according to an exemplary embodiment of the present disclosure, is manufactured to be thinner than the conventional organic light emitting device.

In an organic light emitting device 1000, according to an exemplary embodiment of the present disclosure, the organic passivation layer 400 is not attached to the surface of the thin film encapsulation layer 300 by an adhesive layer but is rather deposited directly on the surface of the thin film encapsulation layer 300, thereby preventing infiltration of impurities into the surface of the thin film encapsulation layer 300 during the deposition process.

In an organic light emitting device 1000, according to an exemplary embodiment of the present disclosure, the organic passivation layer 400 has a larger Young's modulus than the conventional adhesive layer so the Young's modulus of the entire organic light emitting device 1000, according to an exemplary embodiment of the present disclosure, is larger than that of the conventional organic light emitting device, thereby increasing the yield stress, compared to the conventional organic light emitting device.

In an organic light emitting device 1000, according to an exemplary embodiment of the present disclosure, the organic passivation layer 400 has a smaller Young's modulus than the thin film encapsulation layer 300 to reduce the Young's modulus of the organic light emitting device 1000, thereby increasing flexibility of the organic light emitting device 1000.

A method for manufacturing an organic light emitting device according to an exemplary embodiment of the present disclosure will now be described with reference to FIG. 5 to FIG. 7.

Figure 5:
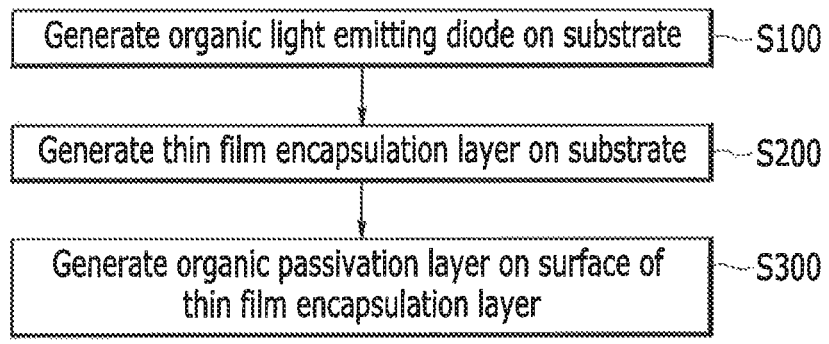
FIG. 5 is a flowchart illustrating a method for manufacturing an organic light emitting device according to an exemplary embodiment of the present disclosure.

FIG. 5 is a flowchart illustrating a method for manufacturing an organic light emitting device according to an exemplary embodiment of the present disclosure. FIG. 6 and FIG. 7 are cross-sectional views illustrating a method for manufacturing an organic light emitting device according to an exemplary embodiment of the present disclosure.

Figure 6:
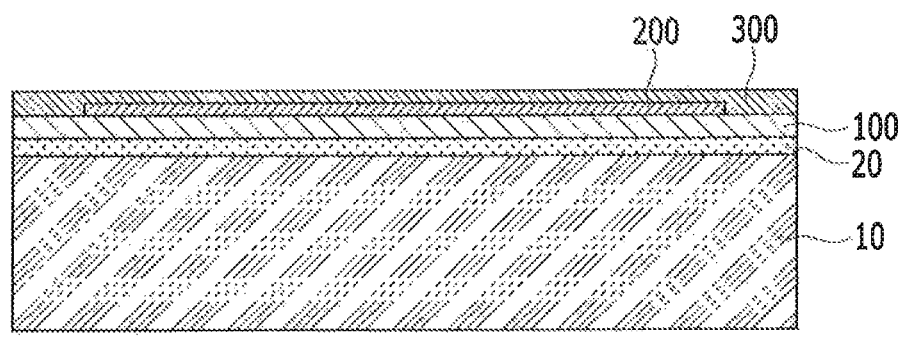
FIG. 6 and FIG. 7 are cross-sectional views illustrating a method for manufacturing an organic light emitting device according to an exemplary embodiment of the present disclosure.

As shown in FIG. 5 and FIG. 6, an organic light emitting diode 200 is disposed on a substrate 100 (S100).

A sacrificial layer 20 is disposed on a supporting substrate 10 that may include glass, and a substrate 100 is disposed on the sacrificial layer 20. The substrate 100 may be generated by depositing or coating an organic material on the sacrificial layer 20, but the present invention is not limited thereto. A driving layer including a plurality of thin film transistors is disposed on the substrate 100, and an organic light emitting diode 200 is disposed on the driving layer.

A thin film encapsulation layer 300 is generated on the substrate 100 (S200).

The thin film encapsulation layer 300 is disposed on the substrate 100 by using a deposition process. The thin film encapsulation layer 300 may be generated by sequentially depositing at least one organic layer and at least one inorganic layer on the substrate 100.

Figure 7:
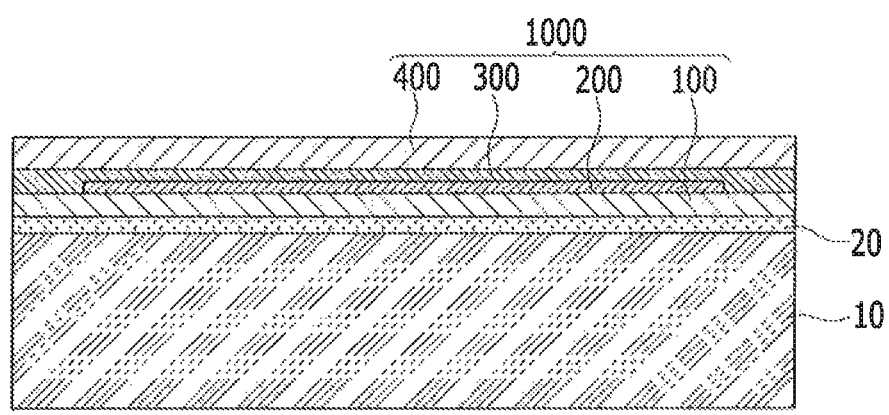

As shown in FIG. 7, an organic passivation layer 400 (S300) is generated on the surface of the thin film encapsulation layer 300.

The organic passivation layer 400 is deposited on the surface of the thin film encapsulation layer 300 to generate the organic passivation layer 400 on the surface of the thin film encapsulation layer 300 in a same chamber in which the thin film encapsulation layer 300 is generated. The deposition of the organic passivation layer 400 may be performed by use of a chemical vapor deposition (CVD) process. The organic passivation layer 400 may be deposited on the surface of the thin film encapsulation layer 300 by using an organic material having a smaller Young's modulus than that of the thin film encapsulation layer 300.

The organic passivation layer 400 is deposited on the surface of the thin film encapsulation layer 300 by the deposition process rather than in an attaching process that uses an adhesive layer in the same chamber in which the thin film encapsulation layer 300 is generated. Accordingly, infiltration of impurities into the surface of the thin film encapsulation layer 300 during the deposition process may be controlled.

For example, the method for manufacturing an organic light emitting device controlling infiltration of impurities into the surface of the thin film encapsulation layer 300 is provided.

The sacrificial layer 20 may be removed by use of laser beams, heat, or solutions to separate the organic light emitting device 1000 from the supporting substrate 10, thereby manufacturing the organic light emitting device 1000.

While exemplary embodiments of the present disclosure have been described with reference to the figures, it is to be understood that the invention is not limited to the disclosed embodiments, but, on the contrary, is intended to cover various modifications and equivalent arrangements included within the spirit and scope of the present disclosure.

What is claimed is:

1. An organic light emitting device comprising:
a substrate;
an organic light emitting diode disposed on the substrate;
a thin film encapsulation layer disposed over the organic light emitting diode, the thin film encapsulation layer including at least one organic layer and a least one inorganic layer; and
an organic passivation layer disposed directly on the thin film encapsulation layer,
wherein the organic passivation layer has a smaller Young's modulus than the at least one organic layer of the thin film encapsulation layer,
wherein the inorganic layer is an uppermost layer of the thin film encapsulation layer, and
wherein the organic passivation layer directly contacts the inorganic layer.

2. The organic light emitting device of claim 1, wherein the organic passivation layer is thicker than the thin film encapsulation layer.

3. The organic light emitting device of claim 1, wherein the organic passivation layer is thicker than the organic layer.

4. The organic light emitting device of claim 1, wherein the organic passivation layer includes an organic material that is different from the at least one organic material of the organic layer.

5. The organic light emitting device of claim 4, wherein the organic passivation layer includes at least one of poly-para-xylylene, polyvinylidene fluoride, polymethylsiloxane, polybutadiene, polymethyl methacrylate, polyacrolein, and polydivinylbenzene.

6. The organic light emitting device of claim 1, wherein the at least one organic layer includes a first organic layer and a second organic layer and the at least one inorganic layer includes a first inorganic layer and a second inorganic layer, and wherein the thin film encapsulation layer includes:
the first organic layer disposed on the organic light emitting diode;
the first inorganic layer disposed on the first organic layer;
the second organic layer disposed on the first inorganic layer; and
the second inorganic layer disposed on the second organic layer.

7. The organic light emitting device of claim 1, wherein the inorganic layer is disposed in plural, and the organic layer is disposed between neighboring inorganic layers from among the plurality of inorganic layers.

8. The organic light emitting device of claim 1, wherein the organic passivation layer is deposited on a surface of the thin film encapsulation layer.

9. The organic light emitting device of claim 1, wherein no adhesive layer is disposed between the thin film encapsulation layer and the organic passivation layer.

10. The organic light emitting device of claim 1, wherein the substrate is flexible.

11. An organic light emitting device, comprising:
a flexible substrate;
an organic light emitting diode disposed on the flexible substrate;
a thin film encapsulation layer disposed on the flexible substrate so as to encapsulate the organic light emitting diode, the thin film encapsulating layer including a first inorganic layer disposed on the organic light emitting diode, an organic layer disposed on the first inorganic layer, and a second inorganic layer disposed on the organic layer;
and
an organic passivation layer disposed over the thin film encapsulation layer,
wherein the organic layer of the thin film encapsulation layer is more elastic than the organic passivation layer, and
wherein the organic passivation layer directly contacts the second inorganic layer.

12. The organic light emitting device of claim 11, wherein the organic passivation layer is thicker than the organic layer of the thin film encapsulation layer.

13. The organic light emitting device of claim 11, wherein the organic passivation layer includes an organic material that is different from an organic material of the organic layer of the thin film encapsulation layer.

14. The organic light emitting device of claim 11, wherein there is no adhesive layer disposed between the organic passivation layer and the thin film encapsulation layer.

15. The organic light emitting device of claim 11, wherein the organic passivation layer is thicker than the thin film encapsulation layer.

* * * * *